United States Patent [19]

Leuthold

[11] 4,352,073
[45] Sep. 28, 1982

[54] COMPLEMENTARY MOS FIELD EFFECT TRANSISTOR AMPLIFIER

[75] Inventor: Oskar Leuthold, Marin, Switzerland

[73] Assignee: Ebauches Electroniques SA, Marin, Switzerland

[21] Appl. No.: 159,073

[22] Filed: Jun. 13, 1980

[30] Foreign Application Priority Data

Jul. 13, 1979 [CH] Switzerland ................ 6544/79

[51] Int. Cl.³ .............................................. H03F 3/30
[52] U.S. Cl. .................................. 330/264; 330/267; 331/116 FE
[58] Field of Search .............. 330/264, 265, 267, 269, 330/273; 331/116 FE

[56] References Cited

U.S. PATENT DOCUMENTS 4,038,607  7/1977  Schade, Jr. ................ 330/264

FOREIGN PATENT DOCUMENTS 2639598  3/1977  Fed. Rep. of Germany .
1512591  1/1968  France .
2259482  8/1975  France .
52-67241  6/1977  Japan ....................... 331/116 FE

*Primary Examiner*—James B. Mullins
*Attorney, Agent, or Firm*—Wender, Murase & White

[57] ABSTRACT

An amplifier includes an inverter with two transistors of complementary types. The first transistor is biased through a third transistor of the same type of conductivity by a first reference voltage, the third transistor being biased by a third voltage of reference. The second transistor is biased through a fourth transistor of the same type of conductivity by a second voltage of reference, the fourth transistor being biased by a fourth voltage of reference. The first and second voltages of reference are determined so that without any alternating input signal the current in the first and second transistors of the inverter is minimum. The third and fourth voltages of reference are determined so that the equivalent resistances of the third and fourth transistors are very high.

6 Claims, 14 Drawing Figures

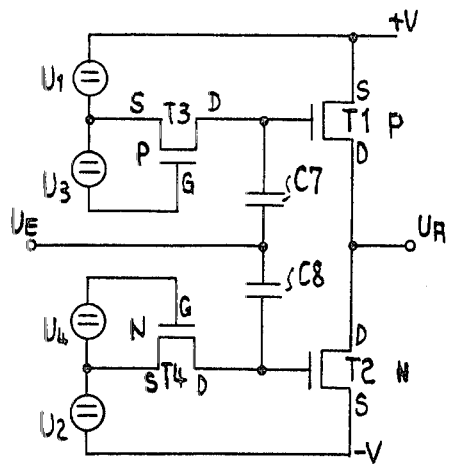
FIG.11
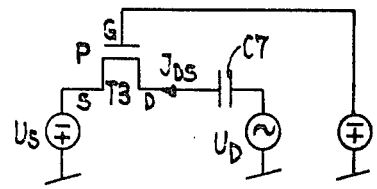
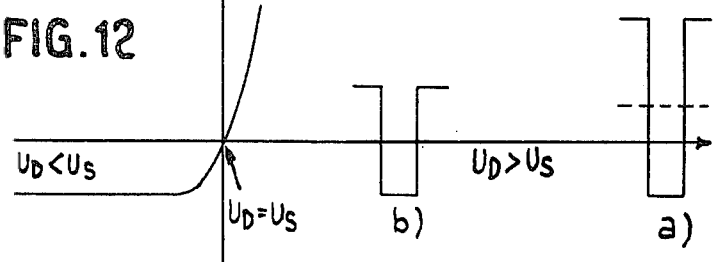
FIG.12
FIG.13
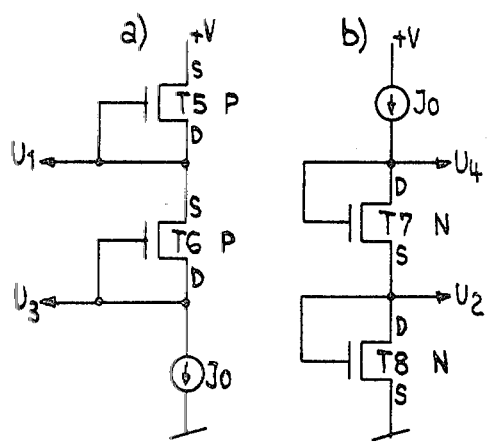
FIG.14
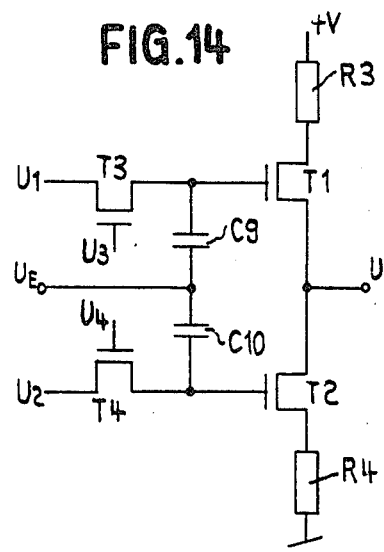

COMPLEMENTARY MOS FIELD EFFECT TRANSISTOR AMPLIFIER

BACKGROUND OF THE INVENTION

The present invention relates to an amplifier for alternating signals in the form of an integrated circuit comprising on the same substrate at least one inverter having a first and a second field effect transistor with insulated gates and of complementary types of conductivity, said first and second transistors receiving on their gates said alternating signals respectively through two coupling capacitors.

Such an amplifier may be used, for example, to increase an alternating voltage of relatively small amplitude delivered by the quartz crystal oscillator of an electronic timepiece to a level suitable for controlling the divider stages normally connected to the output of the oscillator.

FIG. 1 shows a quartz crystal oscillator, the output voltage of which is delivered to the following stages by an amplifier A2, for alternating signals like the one of the present invention. For application to the field of horology, the amplifier A2 comprises generally field effect transistors with insulated gates which permits integration on the same substrate as the other electronic circuits of the timepiece. The current consumption of the amplifier must be kept very low. Known amplifiers which can be integrated are formed of at least an amplifier stage comprising an inverter having two field effect transistors of complementary type of conductivity operating in push-pull. Such amplifiers have the disadvantages either to have a relatively high natural current consumption or to operate satisfactorily only in relation with a very precisely determined supply voltage, or to present a low input resistance and an inadequate output signal with the edges of the output pulses having slowly rising slopes. FIG. 2 shows the circuit diagram illustrating the principle of an inverter with two transistors of complementary type of conductivity which can be utilized in an amplifier according to the present invention in which the drains D and the gates G are respectively connected together. A resistive element (e.g. a transmission gate) is connected between the gates and the drains. This element provides the bias voltage for the inverter so that the voltage gain of the latter is maximum at the choosen operating point F, as indicated in FIG. 3. FIG. 4 shows the current-voltage characteristics $I_{DS}=f(U_{GS})$ of the two transistors of P and N types of conductivity, respectively. In the case of alternating input signals of small amplitudes both transistors are conducting all the time so that in the example of FIG. 4 the current never falls below 50 nA. This current flows directly through both transistors and it does not contribute to the charge or discharge of the capacitor C2 representative of the load impedance of the inverter. For an input signal having a frequency of 32 kHz corresponding to a period of about 30 μS, a charge of at least 3 pC per period of the input signal passes through the transistors, while a charge of 0.75 pC per period of the input signal would be enough to charge and discharge an external capacitor C2 of 0.5 pF. This shows that the circuit has an exaggerated consumption of current which, for a given geometry of the transistors, depends on the difference between the supply voltage $U_B$ and the sum of the threshold voltages $V_{TP}+V_{TN}$ of the transistors of P and N types respectively. In practice, this difference can vary greatly, producing strong variations in current consumption by the amplifier, making such a circuit improper for utilization in any application requiring low current consumption.

FIG. 5 shows the behaviour of an amplifier when the supply voltage $U_B$, is equal to the sum of the threshold voltages. According to the simplified theory of the field effect transistors by which no current flows in the transistor when the bias voltage between gate and source is smaller than the threshold voltage, the direct current in the amplifier of FIG. 5 must be zero. The current consumption is minimum and it depends on the load capacity C2 only. Operation of the amplifier according to the conditions of FIG. 5 is possible if the integrated circuit is provided with a voltage stabilizer. Moreover, a level adapter circuit is also necessary for adapting the level of the logic signals between the part of the amplifier operating at low supply voltage and the part under the full supply voltage.

FIG. 6 shows the principle of biasing for another known circuit which may be utilized in an amplifier for alternating signals in which, in the absence of an alternating input signal, no direct current flows in the transistors. FIG. 7 shows the circuit diagram illustrating the principle of an inverter with two transistors of complementary types biased as indicated in FIG. 6. The transistors T1 and T2 are separately controlled by the alternating input signal delivered by the coupling capacitors C3 and C4 and they are biased through two resistive elements R1 and R2 respectively by the threshold voltages $V_{TP}$ and $V_{TN}$.

The certificate of utility FR No. 2 259 482 describes a circuit like the one of FIG. 8 in which the inverter comprising the transistors T1 and T2 of complementary type is biased by the transistors T5 to T8 in accordance with the principle illustrated in FIG. 6. FIG. 9 shows the simplified biasing circuit of the N-type transistor T2 of FIG. 8. It is to be seen that the transistor T7 is fed by a current source Io which is comprised of transistor T8 in FIG. 8. FIG. 10 shows the $I_{DS}=f(U_{GS})$ characteristic of the biasing transistor T7 of FIGS. 8 and 9. For a gate voltage practically equal to the threshold voltage $V_{TN}$ the current $I_{DS}$ is an exponential function of the gate-source voltage. To the operating point determined by a channel current of 10 nA corresponds a gate-source voltage defined by the characteristic of FIG. 10. The dimensioning of transistor T7 and of the current source Io can be done so that, without any alternating input signal, the voltage $U_{G2}$ is about equal to the threshold voltage $V_{TN}$ of transistor T2. If a rectangular input signal $U_E$ is applied to the circuit through the capacitor C6, FIG. 10 shows that this input signal produces a mean current of 24.2 nA in transistor T7. However, due to the fact that the current source is delivering a current of 10 nA only, the gate voltage of the transistor must decrease until the mean current becomes again 10 nA. Therefore, there exists an effect of level variation due to which the positive half periods of the input signal cannot drive the amplifier transistor T2 noticeably beyond its threshold voltage. The transistor T2 is therefore only weakly driven so that it can deliver a weak current only. By taking into consideration the requirements of a low input capacity, the available range into which the dimensioning of the transistors of the circuit is possible is limited because, in practice, only transistors of minimum dimensions may be utilized. Due to the weak output current, the edges of the pulses of the output signal are rising slowly so that a following stage, e.g. an inverter like the one of FIG. 1, connected to the output of the circuit of FIG. 8 has a strong current consumption. This is the first disadvantage of the circuit of FIG. 8. It reveals itself only when the circuit is coupled to other elements or circuits within the integrated circuit and it makes impossible to use the circuit for extreme requirements of low current consumption imposed on the circuit.

FIG. 10 shows further that strong current peaks flow in the transistor T7. These current peaks represent an ohmic load for the generator of the pulse signals which, in the case of a regulated oscillator with low output voltage, corresponds to critical additional current consumption. This is the second disadvantage of the circuit of FIG. 8.

SUMMARY OF THE INVENTION

An object of the present invention, therefore, is to realize an integrated amplifier for alternating signals with the following features:

- low current consumption, only slightly greater than that required to charge and the discharge the load capacitor;
- maximum input impedance;
- low output capacity;
- strong output current capable of producing output pulses having steep edges; and
- capable of being integrated by any standard manufacturing process in MOS technology.

Thus, an amplifier according to the present invention comprises on the same substrate at least an inverter having a first and a second field effect transistor with insulated gates and of complementary type of conductivity, each of said first and second transistors receiving on their gates said alternating signals respectively through a coupling capacitors, said amplifier further comprising a third transistor for biasing said first transistor and a fourth transistor for biasing said second transistor, said third and fourth transistors being biased in such a manner that their equivalent resistance is very high.

The invention will be described further by way of example with reference to the accompanying drawings.

BRIEF DESCRIPTION OF THE DRAWINGS

FIG. 11 is the circuit diagram illustrating an amplifier according to the present invention;

FIG. 12 is a graph showing the characteristic current-voltage of the transistor T3 of the circuit of FIG. 11;

FIG. 13 shows how the voltage of reference for the circuit of FIG. 11 may be produced; and FIG. 14 shows a circuit diagram of another embodiment of the amplifier according to the present invention.

DESCRIPTION OF THE PREFERRED EMBODIMENT

FIG. 11 shows a possible embodiment of an amplifier according to the invention.

Figure 6:
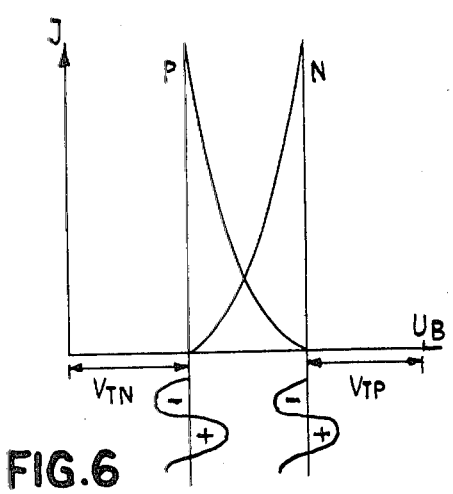
FIG. 6 is a graph showing another principle of biasing for the two transistors of an inverter like the one the circuit of FIG. 2.
Figure 7:
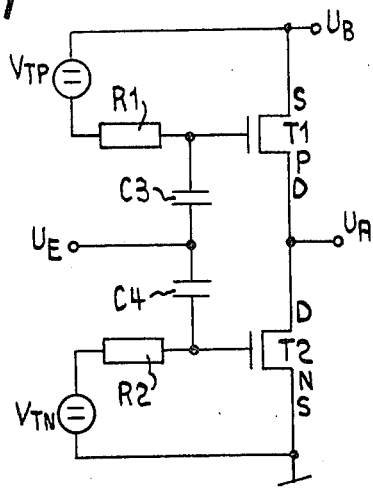
FIG. 7 is the circuit diagram of an inverter biased in accordance with the principle illustrated in the graph of FIG. 6.

The complementary types field effect transistors T1 and T2 with insulated gates form an inverter and they are controlled on their respective gates by the alternating input signal $U_E$ delivered through the input capacitors C7 and C8. Transistor T1 receives on its gate a bias voltage U1 delivered through a field effect transistor T3 with an insulated gate of the same type of conductivity as T1. Transistor T2 receives on its gate a bias voltage U2 delivered through a field effect transistor T4 with an insulated gate of the same type of conductivity as that of T2. The gate of T3 is biased by a voltage U3 and the gate of T4 by a voltage U4. In accordance with FIG. 6 the voltage of reference U1 biasing the gate of T1 is determined so that T1 delivers in the negative half periods of the alternating input voltage $U_E$ a strong current to a load connected at the output $U_A$ of the amplifier and a negligible current in the positive half periods of this input voltage. The output of the amplifier is the point common to the drains of the transistors T1 and T2.

Generally speaking, U1 is practically equal to the threshold voltage of T1. The bias voltage U3 for the gate of T3 is determined so that the equivalent resistance of T3 is very high, e.g. in the order of magnitude of 100 megohms, so that U3 is about twice the threshold voltage of the P-channel transistors under the positive potential of the supply source.

Due to the asymetrical characteristic of transistor T3 which is represented in FIG. 12, the capacitor C7 must discharge when the amplitude of the alternating input voltage increases so that the operating point of transistor T3 is determined every time by the relation $\overline{U_D}=\overline{U_S}$. As can be seen in FIG. 12, an alternating signal (a) symmetrical with respect to $U_D$ produces a current the dc component of which is different from zero. As a result, the capacitor C7 must discharge so that $U_D$ becomes more negative. FIG. 12 shows that the alternating input signal (b), shifted toward the negative values of $U_D$ produces a current $I_{DS}$ in T3 the dc component of which is zero. The discharging of capacitor C7 renders the P-type transistor T1 more conductive which means that the transistor T1 delivers for the input signals of great amplitude a current stronger than the one which would be obtained by a simple biasing resistor.

Figure 8:
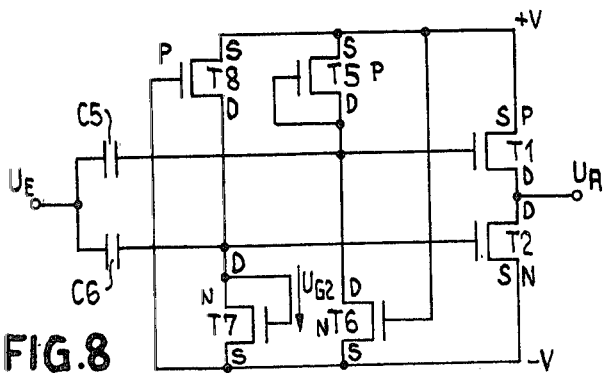
FIG. 8 is the circuit diagram of an amplifier according to FIG. 7.
Figure 9:
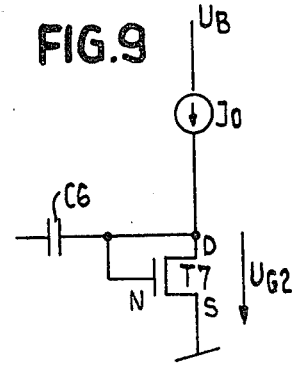
FIG. 9 shows the simplified biasing circuit of transistor T2 of FIG. 8.
Figure 10:
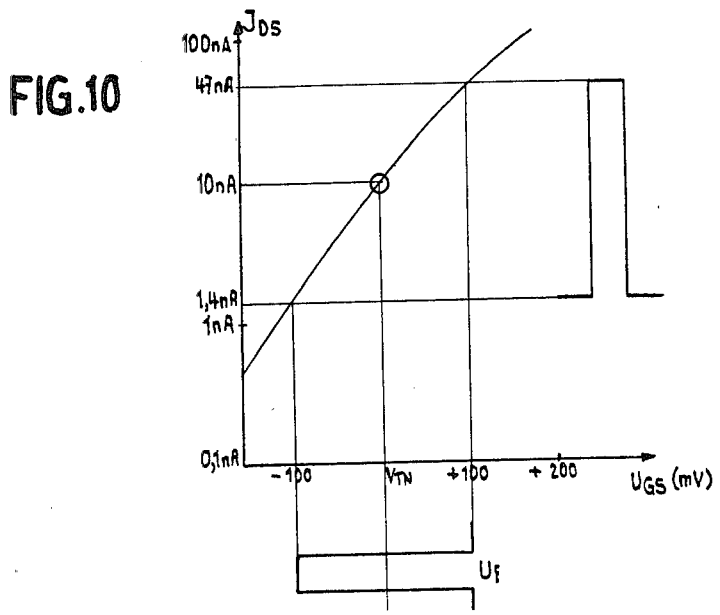
FIG. 10 is a graph showing the characteristic $I_{DS}=f(U_{GS})$ of transistor T7 of FIG. 8.

To the contrary of what happens with the circuit of FIG. 8, and in the first approximation, the biasing circuit of T1, in FIG. 11, maintains the positive peaks at a constant potential, which as a consequence produces a better switching on of the transistor, while the circuit of FIG. 8 has a better switching off. In the case of FIG. 8 the output current remains practically constant which is obvious if one considers that the transistors T7 and T2 on the one hand and the transistors T5 and T1 on the other hand form mirrors of current in which the current in T1 or T2 may have a maximum value only in n times greater than the one of the current of T5 and T7; n is the ratio of the geometries of the transistors according to the relation:

$$n = \frac{\text{width of } T1 \cdot \text{length of } T5}{\text{length of } T1 \cdot \text{width of } T5}$$

In the circuit of FIG. 11 the output current may increase freely which means that the loading capacitor is always charged and discharged rapidly, so that the edges of the pulses of the output signal have a steep slope. Moreover, the circuit allows a greater freedom for the dimensioning of T3 so that it is possible to restrict the peaks of the input current to a very small value during the positive half periods of the input signal which makes the input impedance very high.

The above description which has been made for the transistors T1 and T3 of P-type of conductivity is also valid for the N-types transistors T2 and T4 of the same amplifier, as far as the polarities are respected.

FIG. 13 shows how the voltages of reference U1, U2, U3 and U4 for the circuit of FIG. 11 are produced. For the production of the voltages U1 and U3 is to be seen in FIG. 13a that a constant current source Io is feeding a series connection of two transistors T5 and T6 both of P-type. The gates and the drains of the transistors T5 and T6 are respectively connected together. The source of T6 is connected to the drain of T5 the source of which is connected to the positive pole of the supply. The current source Io is connected between the drain of T6 and the negative pole of the supply. The biasing voltages U2 and U4 for the transistors T2 and T4 are produced by a similar circuit as shown in FIG. 13b, comprising two transistors T7 and T8, both of type N.

Figure 1:
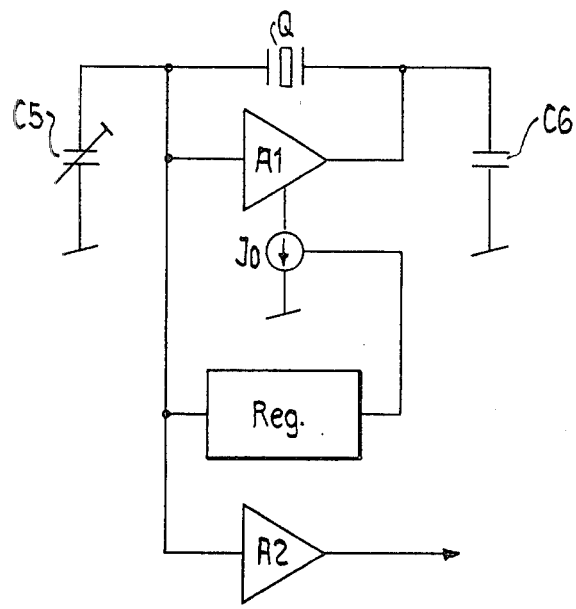
FIG. 1 is the block diagram of a regulated quartz crystal oscillator.
Figure 2:
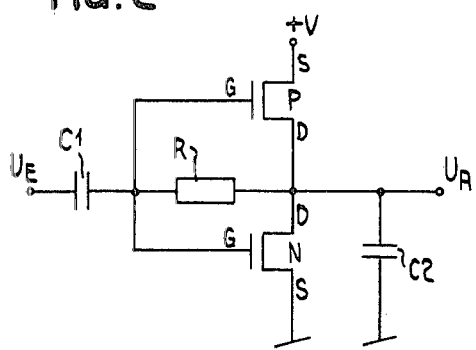
FIG. 2 is the circuit diagram illustrating the principle of an inverter with two transistors of complementary types.
Figure 3:
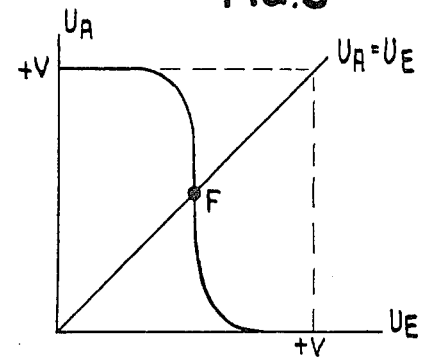
FIG. 3 is a graph showing the transfer function of the inverter of the circuit of FIG. 2.
Figure 4:
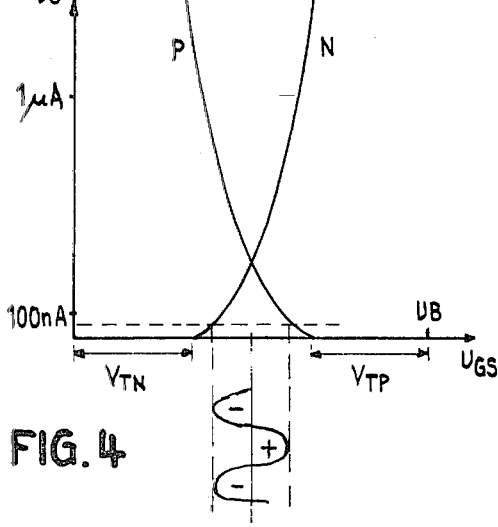
FIG. 4 is a graph showing the characteristics $I_{DS}=f(U_{GS})$ of the two transistors of the circuit of FIG. 2.
Figure 5:
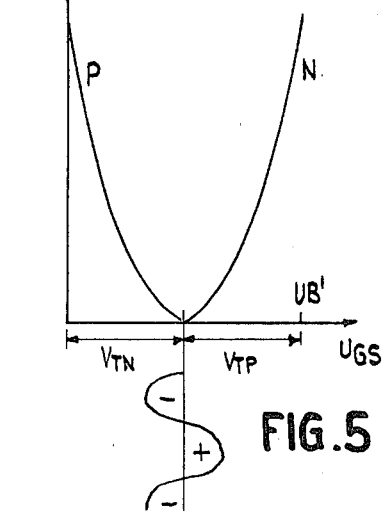
FIG. 5 is a graph showing the characteristics $I_{DS}=f(U_{GS})$ of the two transistors of the circuit of FIG. 2 when the supply voltage is equal to the sum of the threshold voltages.

The circuit of FIG. 11 presents, with respect to the circuit of FIG. 2, the advantage that even without a voltage stabilizer or level adapter the current flowing simultaneously through the two transistors T1 and T2 of the amplifier is negligibly small. With respect to the circuit of FIG. 8 the advantages of the circuit of FIG. 11 are on the one hand that its input impedance may be rendered of a value considerably greater than the one of the circuit of FIG. 8 which permits the utilization of small coupling capacitors C7 and C8, and on the other hand that the output of the amplifier is capable of delivering noticeably more current into the load. These advantages are obtained with standard elements currently produced in the CMOS technology and which are normally found in hundreds or thousands of units within an integrated circuit.

Finally, FIG. 14 shows another embodiment of an amplifier according to the invention in which feedback resistors R3 and R4 have been placed in the connections between the transistors T1 and T2 and the respective poles of the supply. Such a circuit is particularly interesting when the gain of the amplifier must be sterilized to a well determined value.

I claim:

1. A complementary MOS field effect transistor amplifier for alternating signals, comprising:
   an inverter including a first field effect transistor having a first predetermined voltage threshold and a second field effect transistor having a second predetermined voltage threshold, said transistors having insulated gates and being of complementary conductivity;
   a first coupling capacitor connected at one end to said gate of said first transistor and a second coupling capacitor connected at one end to said gate of said second transistor, the alternating signals being applied to the other ends of said capacitors;
   a third transistor coupled for biasing said first transistor substantially to said first threshold voltage; and
   a fourth transistor coupled for biasing said second transistor substantially to said second threshold voltage, said third and fourth transistors being biased to have a high equivalent resistance.

2. An amplifier according to claim 1, wherein the source of said first transistor is connected to a first pole of a power source, the source of said second transistor is connected to a second pole of said power source, the drains of said first and second transistors are connected together and to an output terminal of the amplifier, said gate of said first transistor being further connected to the drain of said third transistor, said gate of said second transistor being further connected to the drain of said fourth transistor, the source of said third transistor is connected to a first voltage of reference, the source of said fourth transistor is connected to a second voltage of reference, the gate of said third transistor is connected to a third voltage of reference and the gate of said fourth transistor is connected to a fourth voltage of reference.

3. An amplifier according to claim 2, wherein said first and second voltages of reference are of values such that current consumption by said first and second transistors is minimized for a given load.

4. An amplifier according to claim 2, wherein a feedback element is connected between said power source and at least one of said first and second transistors, the amplifier having an amplification factor stabilized by said feedback element.

5. An amplifier according to claim 2, wherein said third and fourth transistors each have a predetermined voltage, said third voltage of reference being equal to twice the sum of the threshold voltages of said first and third transistors below the potential of said first pole of said power source, and said fourth voltage of reference being equal to twice the sum of the threshold voltages of said second and fourth transistors above the potential of said second pole of said power source, whereby attenuation of the alternating signals applied to said gates of said first and second transistors is avoided.

6. An amplifier according to claim 1, wherein said third transistor is a field effect transistor with an insulated gate and is of the same type of conductivity as said first transistor, and said fourth transistor is a field effect transistor with an insulated gate and is of the same type of conductivity as said second transistor.

* * * * *